United States Patent [19]

Hynecek

[11] Patent Number: 5,726,710
[45] Date of Patent: Mar. 10, 1998

[54] LOW NOISE HIGH PERFORMANCE CHARGE DETECTION SYSTEM

[75] Inventor: Jaroslav Hynecek, Richardson, Tex.

[73] Assignee: Texas Instruments Incorporated, Dallas, Tex.

[21] Appl. No.: 538,306

[22] Filed: Oct. 3, 1995

Related U.S. Application Data

[63] Continuation of Ser. No. 297,340, Aug. 29, 1994, abandoned.

[51] Int. Cl.$^6$ .................... H04N 5/335; H04N 3/14
[52] U.S. Cl. ................... 348/311; 333/165; 377/60
[58] Field of Search .................... 348/311, 316, 348/318, 319, 250, 249; 250/332, 370.08; 257/234, 239, 224; 377/60, 58; 356/326; 333/165, 18; 327/277; H04N 5/335, 3/14

[56] References Cited

U.S. PATENT DOCUMENTS

| | | | |
|---|---|---|---|
| 4,229,752 | 10/1980 | Hynecek | 357/24 |
| 4,288,764 | 9/1981 | Ong | 333/165 |
| 4,398,301 | 8/1983 | Dyck | 377/60 |
| 4,609,823 | 9/1986 | Berger et al. | 250/370.09 |
| 5,060,070 | 10/1991 | Nishida et al. | 348/250 |
| 5,101,174 | 3/1992 | Hynecek | 330/264 |
| 5,151,380 | 9/1992 | Hynecek | 437/53 |

OTHER PUBLICATIONS

*Solid State Imaging*, G. F. Amelio, et al., Research and Development Laboratory, Fairchild Camera and Instrument Corporation, Palo Alto, CA, pp. 605–614.

*Virtual Phase Technology*, Jaroslav Hynecek, IEEE Transactions on Electron Devices, vol. ED–28, No. 5, May 1981, 483–489.

*Primary Examiner*—Andrew Faile
*Assistant Examiner*—Andrew B. Christensen
*Attorney, Agent, or Firm*—Alan K. Stewart; Richard L. Donaldson; Wade J. Brady, III

[57] ABSTRACT

The charge coupled device (CCD) charge detection system includes a first CCD register having N non-destructive charge readouts where N is an integer greater than one, and N second CCD registers coupled to the N non-destructive charge readouts where each of the N second CCD registers is coupled to a corresponding one of the N non-destructive charge readouts.

4 Claims, 6 Drawing Sheets

LOW NOISE HIGH PERFORMANCE CHARGE DETECTION SYSTEM

This application is a continuation of application Ser. No. 08/297,340, filed Aug. 29, 1994, now abandoned.

FIELD OF THE INVENTION

This invention relates generally to image sensors, and more specifically to charge detection systems for charge coupled devices.

BACKGROUND OF THE INVENTION

Development of high resolution image sensors presents a problem for detection of small amounts of charge (small pixel size) at high frequencies such as 70 MHz. Some existing solutions to this problem are based on small detection nodes (with small capacitances and therefore high sensitivity) which, however, have small output driving capability, that must be followed by several amplification stages (source followers) which introduce delay and increased noise due to a wider bandwidth.

Another solution to this problem is based on a distributed floating gate amplifier (DFGA) as disclosed in G. F. Amelio & R. H. Dyck, "Distributed Floating Gate Amplifier", in *Solid State Imaging* 605–14 (1976). The DFGA utilizes non-destrucive charge sensing of signal charge in charge coupled devices. The signal charge in the charge coupled device is passed under a sensing electrode and then further transported to other sensing electrodes with no signal degradation. Using the non-destructive charge sensing, the DFGA repetitively samples the video signal and sums the result. By sensing the signal charge repeatedly, the signal-to-noise ratio relative to a single stage amplifier is improved depending on the number of times the signal is sensed.

The DFGA uses two CCD registers. The signal charge is non-destructively read out from the first CCD register and is summed together in the second CCD register. The detected signals are combined in the second CCD register such that proper reconstruction of the signal in the time domain is automatically obtained. A problem with the DFGA is that the charge wells in the second CCD register must be large enough to hold all of the charge that is summed together from the repetitive sensing.

SUMMARY OF THE INVENTION

Generally, and in one form of the invention, a charge coupled device (CCD) charge detection system includes a first CCD register having N non-destructive charge readouts where N is an integer greater than one, and N second CCD registers coupled to the N non-destructive charge readouts where each of the N second CCD registers is coupled to a corresponding one of the N non-destructive charge readouts.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
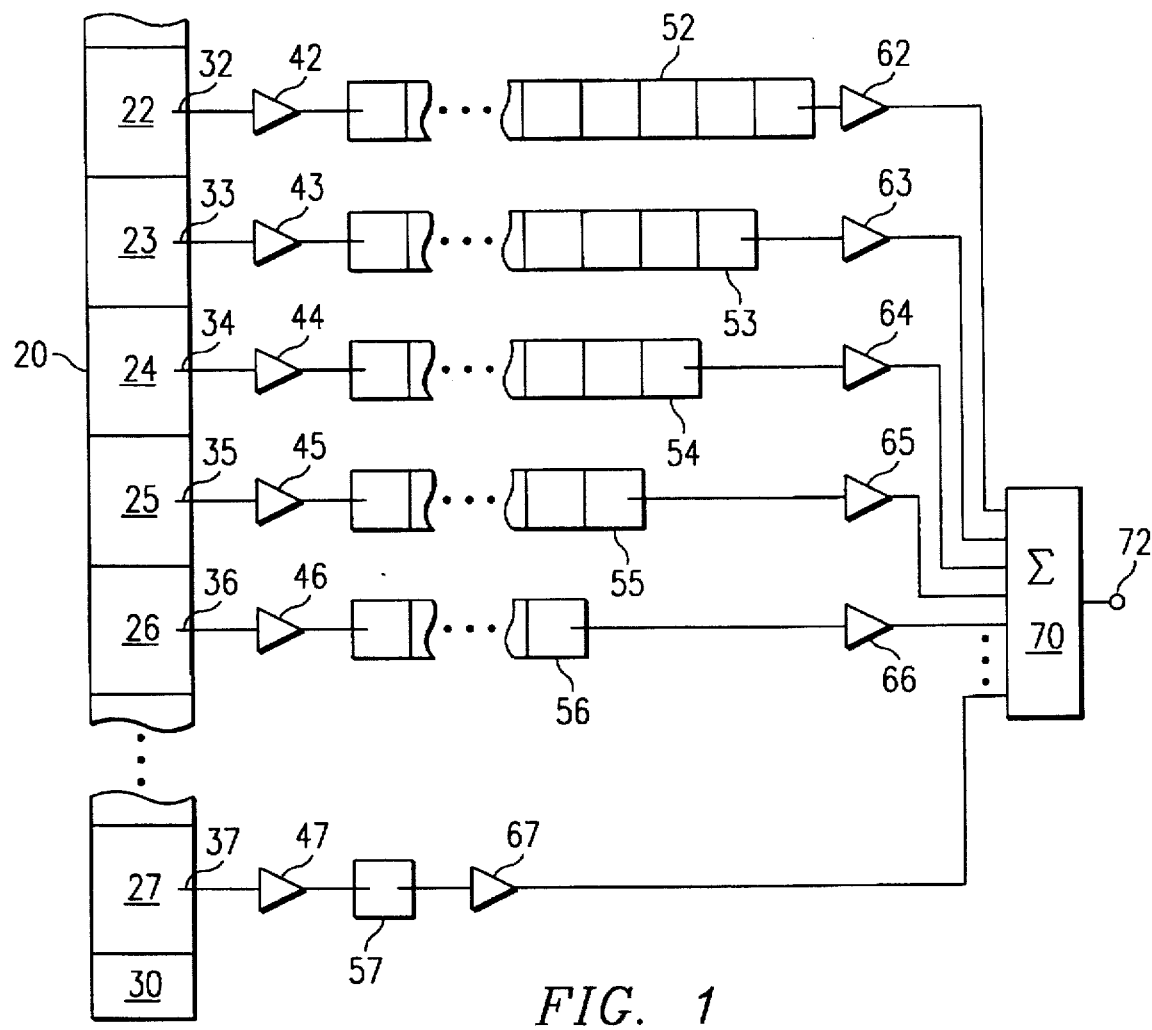
FIG. 1 is a schematic diagram of a preferred embodiment low noise high performance charge detection system.

A schematic diagram representation of the basic system architecture for the preferred embodiment charge detection system is depicted generally in FIG. 1. The device in FIG. 1 includes vertical CCD register 20 having N stages with only stages 22–27 shown in FIG. 1, charge drain 30, and N non-destructive charge detection nodes with only nodes 32–37 shown in FIG. 1; N input charge detection amplifiers with only amplifiers 42–47 shown in FIG. 1; N horizontal CCD registers with only registers 52–57 shown in FIG. 1; N charge detection amplifiers with only amplifiers 62–67 shown in FIG. 1; and output summing node 70. CCD register 52 has N stages with only six complete stages shown. CCD register 53 has N–1 stages with only five complete stages shown. CCD register 54 has N–2 stages with only four complete stages shown. CCD register 55 has N–3 stages with only three complete stages shown. CCD register 56 has N–4 stages with only two complete stages shown. CCD register 57 has 1 stage.

Charge propagates in the direction from stage 22 to charge drain 30 in the CCD register 20, shown in FIG. 1, and is sensed by the input charge detection amplifiers 42–47. There are N identical stages of such amplifiers before charge is finally transported to the output charge drain 30. Signal from the input charge detection amplifiers 42–47 is converted to charge and injected into horizontal CCD registers 52–57.

There are N horizontal CCD registers of which registers 52–57 are shown. Each horizontal CCD register has a different length than the others. Moving down from the top to the bottom of FIG. 1, each horizontal CCD register has one less stage than the previous horizontal CCD register. For the preferred embodiment, the number of stages in the horizontal registers 52–57 decrease from N to 4 from the top to the bottom of FIG. 1. As the signal charge propagates downward in the vertical CCD register 20, corresponding charge signal propagates from left to right in the horizontal registers 52–57. Due to the various (decreasing) length of the horizontal registers 52–57, charge will arrive at the output of each horizontal register at the same time. The signals from the horizontal registers 52–57 are combined at the summing node 70 which provides the output at node 72.

In the circuit described in FIG. 1, the actual charge is not added, only the output signals from the horizontal registers 52–57 are added which has a similar effect. Charge is sensed at the end of each horizontal CCD register 52–57 by charge detection amplifiers 62–67. The outputs of charge detection amplifiers 62–67 are coupled to output summing node 70. The output summing node 70 adds the signals from the horizontal registers 52–57 to provide the output at node 72.

Repeating of sensing and summing, as described above for the device of FIG. 1, has several benefits. One benefit is that noise is reduced by the averaging effect. Another benefit is that speed is not sacrificed because all signal processing is accomplished in synchronization with the clock. Output driving capability of this circuit is thus proportional to the number of stages with noise being reduced by $\sqrt{N}$. A high speed single stage output is enough to drive the load.

Figure 2:
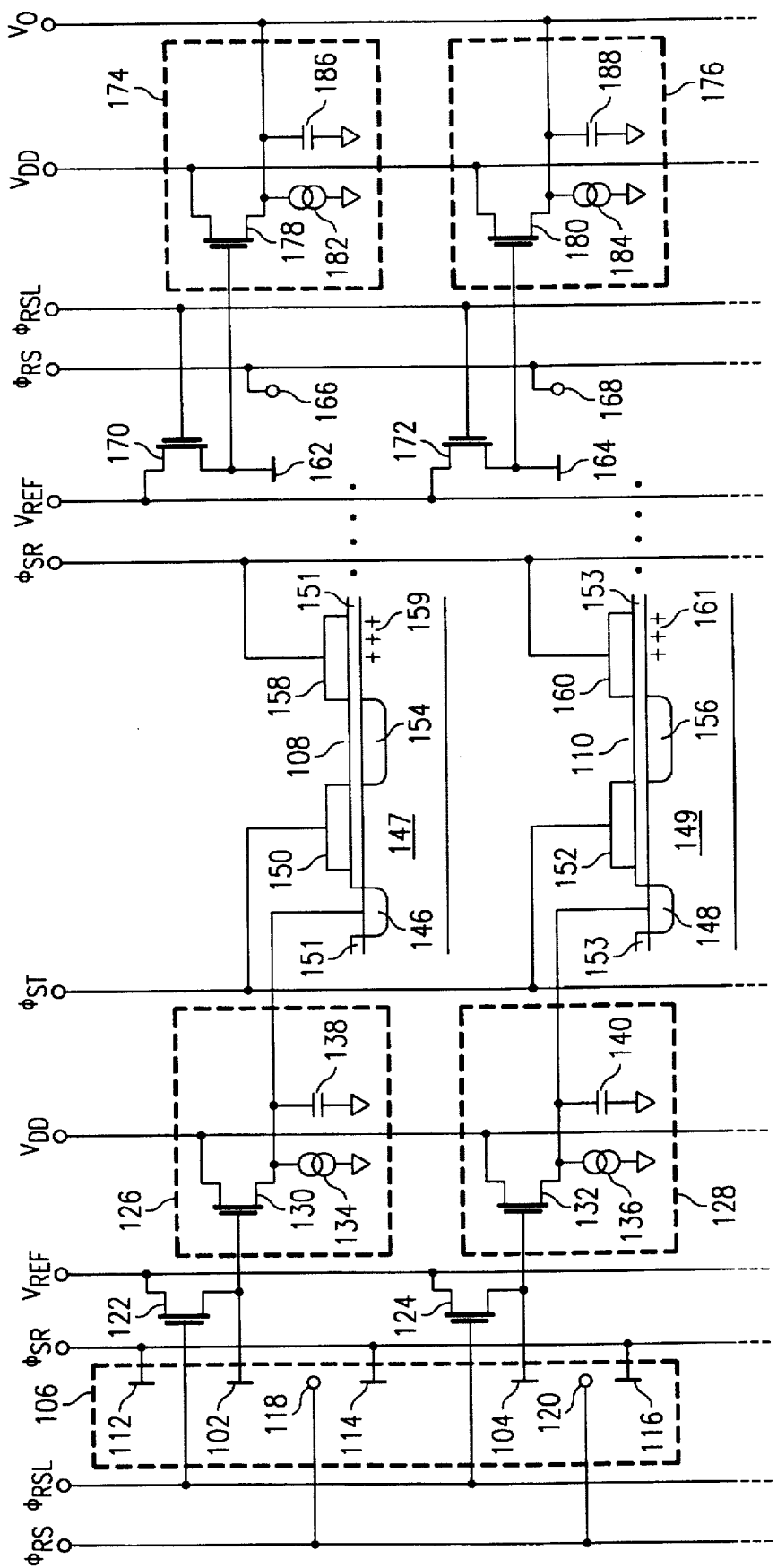
FIG. 2 is a circuit diagram of a preferred embodiment low noise high performance charge detection system.
Figure 9:
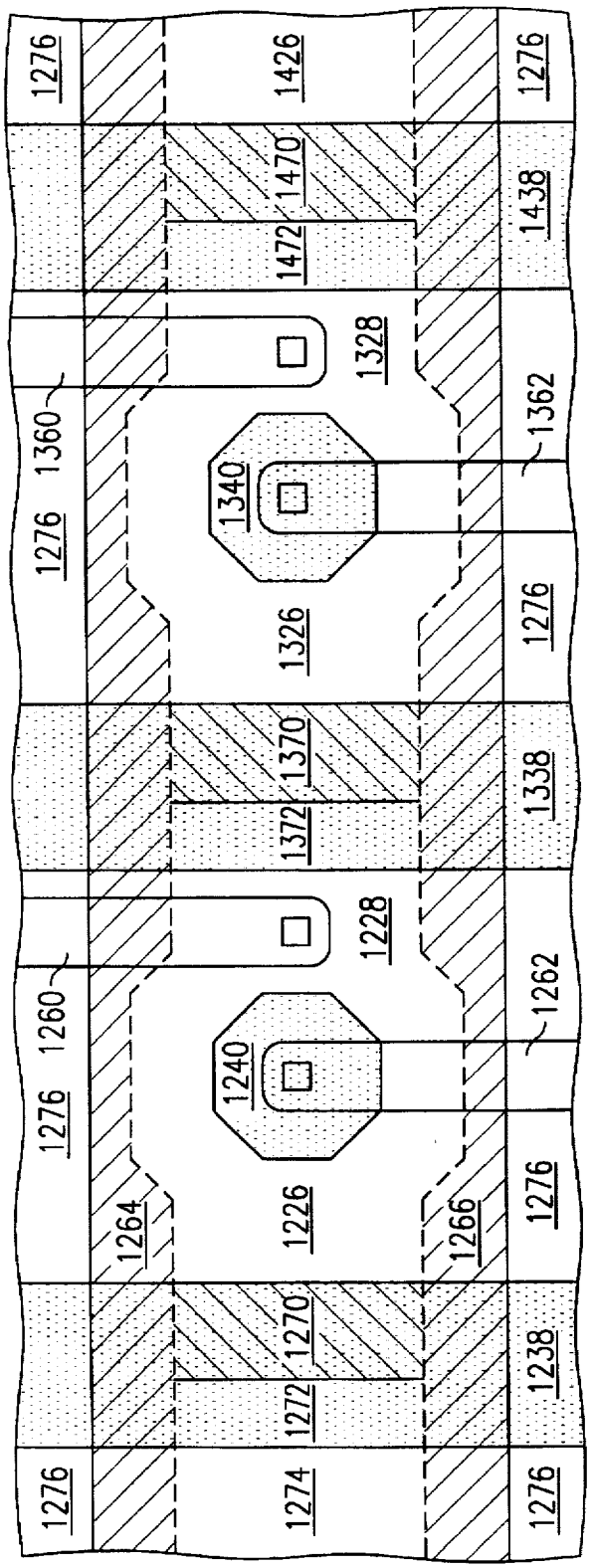
FIG. 9 is a plan view of a second preferred embodiment floating gate charge detection node.
Figure 10:
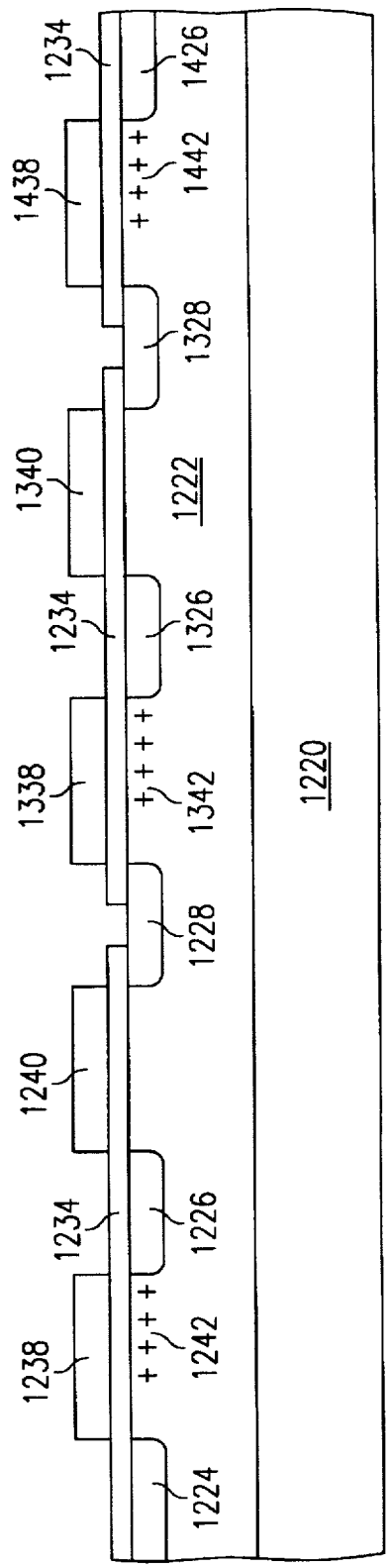
FIG. 10 is a cross-section of the second preferred embodiment floating gate charge detection node through the line A—A' shown in FIG. 9.

A circuit diagram of a section of a preferred embodiment low noise high performance charge detection system is shown in FIG. 2. The circuit of FIG. 2 shows two of the N charge detection nodes 102 and 104 in the vertical CCD register 106 and the corresponding horizontal CCD registers 108 and 110. The circuit of FIG. 2 includes CCD register 106 which consists of non-destructive readouts 102 and 104 (floating gates), transfer gates 112, 114, and 116, and resistive gates 118 and 120; reset transistors 122 and 124; amplifier circuits 126 and 128 which consist of transistors 130 and 132, current sources 134 and 136, and parasitic layout capacitances 138 and 140; the input stage of CCD registers 108 and 110 which consist of N+input regions 146 and 148, and strobe gates 150 and 152; N type semiconductor regions 147 and 149; insulator layers 151 and 153; virtual gates 154 and 156; transfer gates 158 and 160; donor implants 159 and 161; charge detection nodes 162 and 164; reset nodes 166 and 168; reset transistors 170 and 172; and amplifier circuits 174 and 176 which consist of transistors 178 and 180, current sources 182 and 184, and parasitic layout capacitances 186 and 188. A detailed view of a specific embodiment of the CCD register 106 is shown in FIGS. 9 and 10.

The input and output signals to the circuit of FIG. 2 include CCD transfer gate clocked voltage $\phi_{SR}$, reference voltage $V_{REF}$, resistive gate clocked voltage $\phi_{RS}$, refresh clocked voltage $\phi_{RSL}$, output voltage $V_o$, strobe gate clocked voltage $\phi_{ST}$, and source voltage $V_{DD}$.

The preferred embodiment low noise high performance charge detection system shown in FIG. 2 is based on a distributed amplification system and a non-destructive charge detection concept using floating gate detection nodes 102 and 104 with resistive gate resets 118 and 120. The resistive gate resets 118 and 120 provide a pixel rate non-destructive readout. After charge is sensed, it can be transferred to another similar charge detection node through CCD channels for repeated sensing.

The bias on the floating gates 102 and 104 needs to be periodically refreshed to maintain the desired potential. This is accomplished by reset transistors 122 and 124 which are coupled between $V_{REF}$ and the floating gates 102 and 104. The reset transistors 122 and 124 are preferably dual gate structures which have low feed through pulse. Other reset structures such as diodes are also possible. The floating gates 102 and 104 are reset only once for each line of video signal by the clocking of $\phi_{RSL}$. The kTC noise associated with this reset is eliminated by dark pixel reference subtraction at the start of each line. This kTC noise thus does not affect the pixel rate signal.

Figure 3:
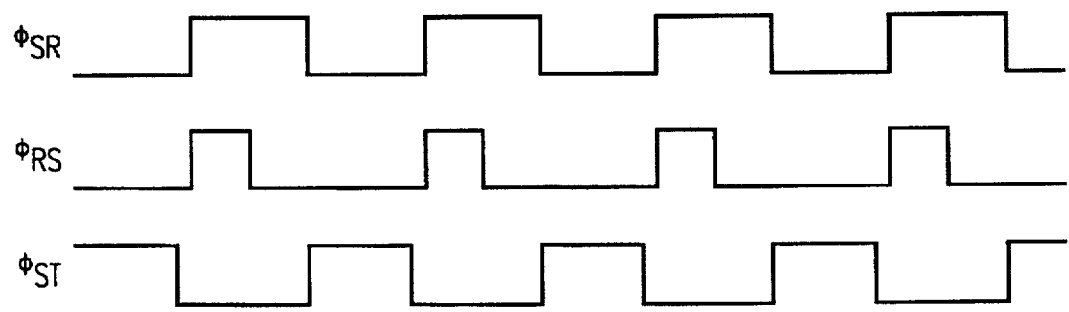
FIG. 3 is a waveform diagram of the clocked signals for the circuit of FIG. 2.

FIG. 3 is a timing diagram for the clocked signals of the device in FIG. 2. $\phi_{RSL}$ is not shown because it is clocked high only once for each line of video data. Charge propagates in the direction from transfer gate 112 to transfer gate 116 in CCD register 106 in response to clocked signals $\phi_{SR}$ and $\phi_{SR}$, shown in FIG. 3. As a group of charge moves down the CCD register 106, it is first sensed by detection node 102. In response to the signal on detection node 102, the amplifier 126 injects charge into the first stage of horizontal CCD register 108 through N+ region 146 when the strobe gate 150 is clocked by $\phi_{ST}$. The signal is sampled by strobe gate 150 using diode cut-off-method. Then on the next clock cycle of $\phi_{SR}$ and $\phi_{RS}$, the group of charge below detection node 102 continues through CCD register 106 until it stops below detection node 104. The group of charge is then detected by amplifier 128 and injected into the first stage of horizontal CCD register 110. During the same clock cycle of $\phi_{SR}$, the group of charge that was previously injected into the first stage of register 108 is shifted to the second stage of register 108. Therefore, the group of charge in register 108 is one stage ahead of the corresponding group of charge in register 110. Since CCD register 110 has one less stage than CCD register 108, the corresponding charge groups reach the detection nodes 162 and 164 at the same time. The signals at charge detection nodes 162 and 164 are then detected by amplifiers 174 and 176. The outputs of amplifiers 174 and 176 are combined to provide the output $V_o$.

CCD registers 108 and 110, shown in FIG. 2, are buried channel virtual phase CCD devices that are well known in the art. Other types of CCD registers could also be used. Charge injection structures which include N+ regions 146 and 148, and strobe gates 150 and 152 are also well known in the art. Other types of charge injection structures such as fill-and-spill could also be used.

Figure 4:
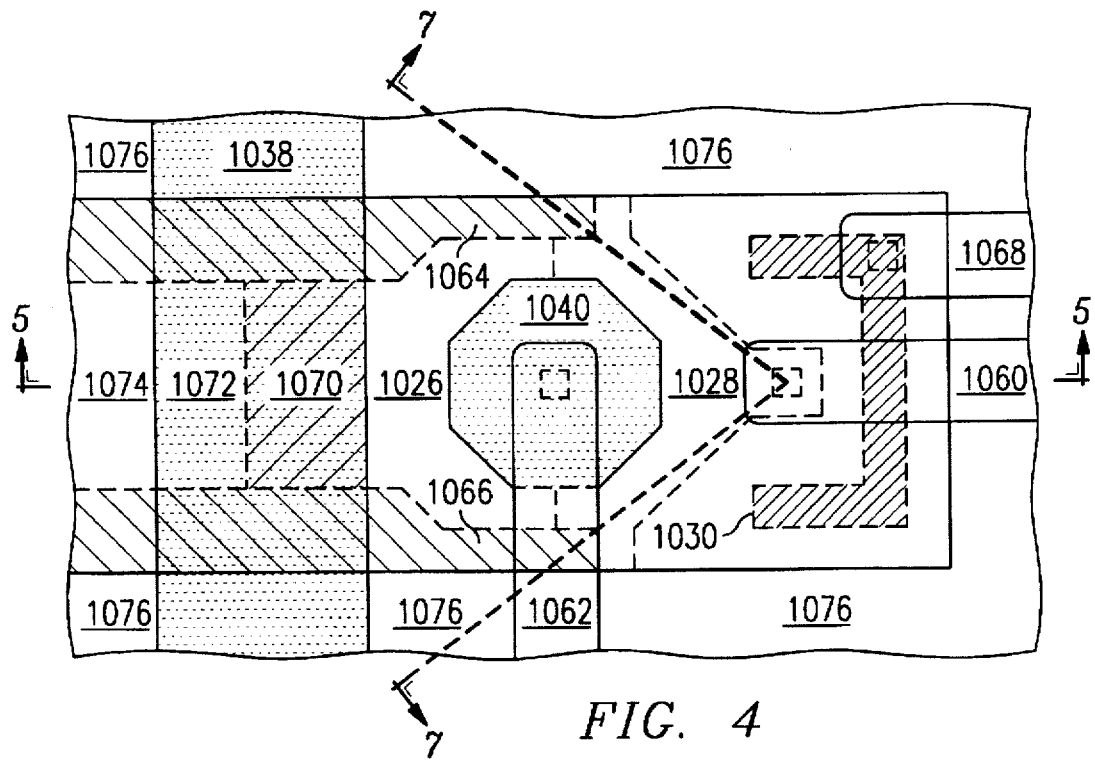
FIG. 4 is a plan view of a first preferred embodiment floating gate charge detection node.

FIG. 4 is a plan view of a first preferred embodiment floating gate charge detection node. The structure of FIG. 4 includes transfer gate 1038, floating gate 1040, reset metal lead 1060, floating gate metal lead 1062, channel stop regions 1064 and 1066, virtual barrier region 1026, virtual well region 1028, N+ drain region 1030, drain metal lead 1068, clocked well region 1070, clocked barrier region 1072, virtual well region 1074, and thick field oxide 1076.

Figure 5:
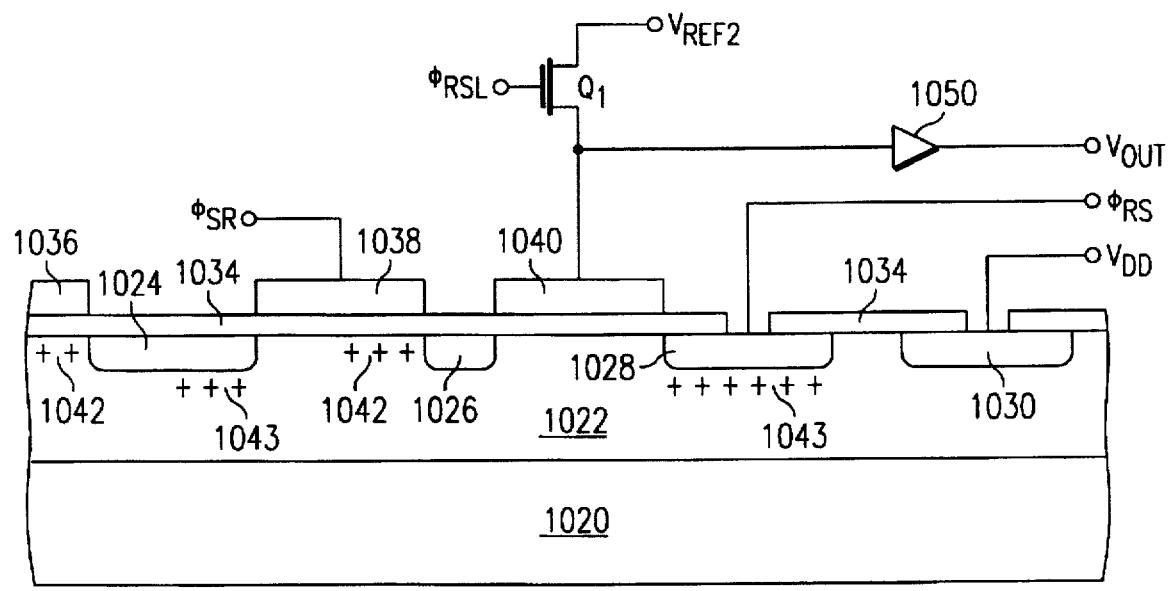
FIG. 5 is a cross-section of a first preferred embodiment floating gate charge detection node through the line A–A' shown in FIG. 4.
Figure 6:
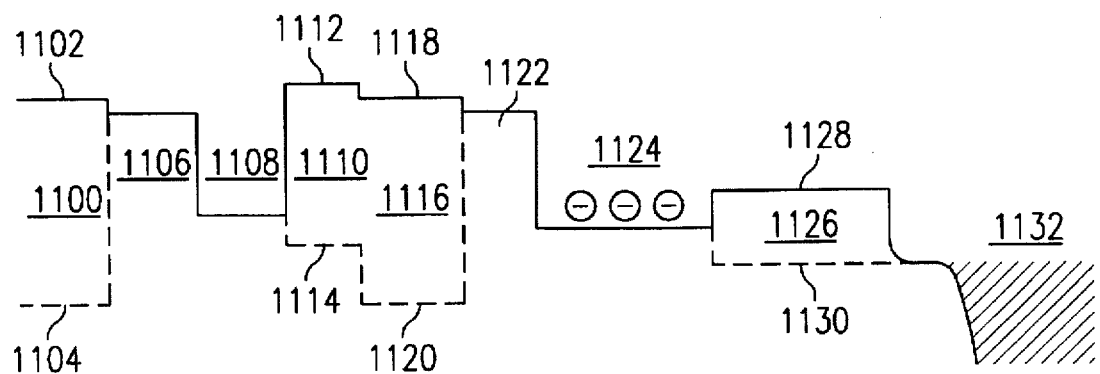
FIG. 6 is a diagram of the potential wells created by the device of FIG. 4.

FIG. 5 is a cross-sectional view of FIG. 4 taken along the axis A–A'. FIG. 6 is a corresponding potential diagram of the same cross-section. The structure of FIG. 5 includes P type silicon substrate 1020, N type layer 1022 in the substrate 1020, P+ virtual gate regions 1024, 1026, and 1028 formed in the upper portion of N type layer 1022, gate insulator layer 1034, transfer gates 1036 and 1038, floating gate 1040, donor implants 1042 in the N type layer 1022, donor implants 1043 below virtual phase regions 1024 and 1028, N+ drain 1030, transistor $Q_1$, amplifier 1050, serial register clocked voltage $\phi_{SR}$, reference voltage $V_{REF2}$, reset clocked voltage $\phi_{RS}$, refresh clocked voltage $\phi_{RSL}$, output voltage $V_{OUT}$, and drain voltage $V_{DD}$. Reset metal lead 1060 and floating gate metal lead 1062, shown in FIG. 4, are not shown in FIG. 5. Transfer gate 1036, shown in FIG. 5, is not shown in FIG. 4. $\phi_{SR}$ is the serial register clock signal which controls the CCD shift register. $\phi_{RS}$ is the reset clock signal which controls the virtual gate 1028. $V_{OUT}$ is the output signal from the amplifier 1050. $V_{REF2}$ is the bias signal for the floating gate 1040. $V_{DD}$ is the drain voltage. $\phi_{RSL}$ is the gate input signal for the transistor $Q_1$. Drain 1030 can be replaced with another transfer gate, as shown in FIG. 9. Donor implants 1043 below virtual gate region 1028 can be left out of the circuit if a lower voltage is used for $V_{REF2}$, as described below for the device of FIG. 1010. The device of FIG. 5 without the donor implants 1043 below virtual gate 1028 can be used to form charge detection nodes 162 and 164, and reset nodes 166 and 168, shown in FIG. 2.

The potential diagram of FIG. 6 includes clocked well 1100 with potential levels 1102 and 1104, virtual barrier 1106, virtual well 1108, clocked barrier 1110 with potential levels 1112 and 1114, clocked well 1116 with potential levels 1118 and 1120, virtual barrier 1122, floating gate well 1124, virtual well 1126 with potential levels 1128 and 1130, and charge drain region 1132.

Figure 7:
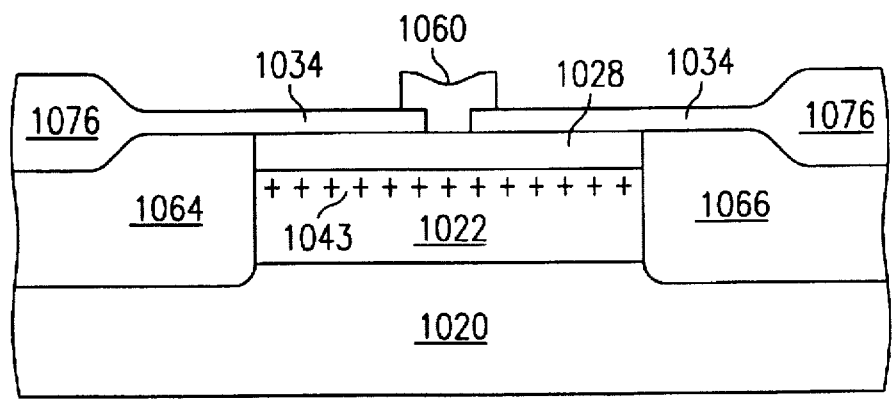
FIG. 7 is a cross-section of the first preferred embodiment floating gate charge detection node through the line B–B' shown in FIG. 1.
Figure 8:
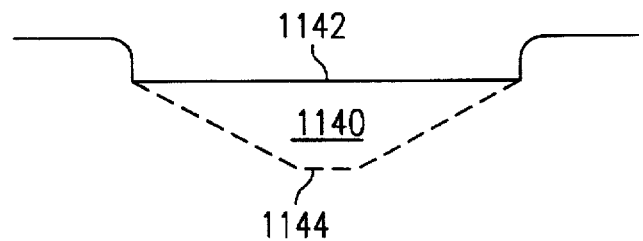
FIG. 8 is a diagram of the potential wells created by the device of FIG. 4.

FIG. 7 is a cross-sectional view of FIG. 4 taken along the line B–B'. FIG. 8 is a corresponding potential diagram of the same cross-section. The structure of FIG. 7 includes P type silicon substrate 1020, N type layer 1022 in the substrate 1020, P+ virtual phase region 1028 formed in the upper portion of N type layer 1022, gate insulator layer 1034, donor implants 1043 below virtual phase region 1028, channel stop regions 1064 and 1066, thick field oxide 1076, and reset metal lead 1060.

The potential diagram of FIG. 8 shows virtual well 1140 at potential levels 1142 and 1144. potential level 1142 corresponds with potential level 1128 in FIG. 6. potential level 1144 corresponds with potential level 1130 in FIG. 6. Potential level 1142 is the potential level when $\phi_{RS}$ is off. Potential level 1144 is the potential level when $\phi_{RS}$ is on.

In standard virtual phase CCD it is difficult to implement a floating gate detection node due to the necessity for a negative bias on the floating gate and no capability for reset. The resistive gate approach of the preferred embodiment eliminates the need for a negative bias on the floating gate and provides the capability for reset.

A bias voltage $V_{REF2}$ of several volts generates a potential well 1124, shown in FIG. 6, under the floating gate 1040 for collection of charge underneath. The floating gate 1040 is coupled to amplifier 1050 and reset transistor $Q_1$. The floating gate potential well 1124 is restored after each line of image data by pulsing $Q_1$ on. As charge is transferred into well 1124, the voltage on the floating gate 1040 changes and is sensed by the amplifier 1050. After the sensing is completed, signal charge is transferred out of the floating gate well 1124 by pulsing the virtual gate 1028 positive. Since virtual gate 1028 is connected resistively to substrate 1020 through channel stop regions 1064 and 1066, a current will flow laterally through this gate. When the potential is high enough, the potential well 1126, shown in FIG. 6, under virtual gate 1028 will increase to the point that a complete reset will occur. (A complete reset is when all charge is cleared from the floating gate potential well 1124.) During reset, charge is transferred out of the floating gate well 1124, through the virtual well 1126, and into charge drain region 1132, or in the case of continuing CCD structures, into the clocked barrier and clocked well of the next CCD stage.

The operation of the device of FIG. 4 is explained in more detail by referring to the potential profile shown in FIG. 6. The energy levels for an electron in the buried channel (conduction band minimum) are shown for the various regions of the device and for different bias levels of the transfer gates 1036 and 1038, and different bias levels of the virtual gate 1028 (resistive gate). Starting with an electron in the clocked barrier 1110 at level 1114 below transfer gate 1038 with the transfer gate bias approximately equal to substrate bias, the operation is as follows. First the electron moves into the clocked well 1116 at level 1120. The electron will remain in the clocked well 1116 as long as the transfer gate bias is approximately equal to substrate bias because the potential wells of both adjacent regions are at a lower potential. When the transfer gate 1038 is switched to a negative bias with respect to the substrate 1020, the potential level of the clocked well 1116 changes to level 1118 and the potential level of clocked barrier 1110 changes to level 1112. As a result, the electron passes from the clocked well 1116 to the virtual barrier 1122. The electron then moves from the virtual barrier 1122 into the floating gate well 1124 where the presence of charge is detected through sensing the potential of the floating gate 1040.

For reset, virtual gate 1028 is biased positive by clocked voltage $\phi_{RS}$ which changes the potential level of virtual well 1126 from level 1128 to level 1130. As a result, the electron passes from the floating gate well 1124 to the virtual well 1126. The electron then moves into the charge drain region 1132 where it is removed. The electron can also continue into another gate similar to gate 1038 for additional sensing. Charge removal from the well 1124 is called reset. This reset process provides a complete reset because there is no charge remaining in the floating gate well 1124 after charge is transferred to the charge drain region 1132 or to the next CCD stage.

The transfer gates 1036 and 1038, shown in FIG. 5, make up a portion of a CCD shift register. The remaining portion of the CCD shift register is not shown. The CCD shift register transfers charge to the charge detection node. The structure of the transfer gates is shown by the transfer gates 1036 and 1038, shown in FIG. 5. Charge is transferred through the shift register to the charge detection node by clocking the voltages on the transfer gates. Once charge is transferred into the floating gate well 1124, charge is detected by sensing the voltage at the floating gate 1040.

The timing cycle starts with a reset period to clear charge from the floating gate well 1124. For the reset period, the reset signal $\phi_{RS}$ is switched on. The reset signal $\phi_{RS}$ causes a current to flow through the virtual gate 1028 to the channel stop regions 1064 and 1066 and on to the substrate 1020. The amount of current is determined by the resistivity of the virtual gate and the signal $\phi_{RS}$. $\phi_{RS}$ increases the potential of the virtual well 1126 to level 1130, shown in FIG. 6. This forces charge to move from the floating gate well 1124 to the charge drain region 1132.

After the reset period, the reset signal $\phi_{RS}$ returns to a lower voltage. Then the floating gate well 1124 is ready to receive charge from the shift register. The serial register clock signal $\phi_{SR}$ is then switched to a low voltage which changes the potential of transfer gate well 116 from level 1120 to level 1118. This causes charge in the last transfer gate well 1116, shown in FIG. 6, to move into the floating gate well 1124. When charge moves into the floating gate well 1124, the potential level of the floating gate well 1124 changes. The potential level of the floating gate well 1124 is dependent on the amount of charge that is transferred from the last transfer well of the serial register. This change in potential level is sensed on the floating gate 1040.

Another transfer gate can be added to the circuit of FIG. 4 in place of the charge clearing drain 1028 to facilitate multiple detection of the same charge. A second preferred embodiment, shown in FIG. 9, includes two floating gate detection nodes connected in series. FIG. 9 is a plan view of the second preferred embodiment floating gate charge detection node. The structure of FIG. 9 includes transfer gates 1238, 1338, and 1438, floating gates 1240 and 1340, reset metal leads 1260 and 1360, floating gate metal leads 1262 and 1362, channel stop regions 1264 and 1266, virtual gate regions 1274, 1226, 1228, 1326, 1328, and 1426, clocked well regions 1270, 1370, and 1470, clocked barrier regions 1272, 1372, and 1472, and thick field oxide 1276. Virtual gate regions 1226 and 1228 form a virtual gate that surrounds the region below floating gate 1240, as shown in FIG. 9. Virtual gate regions 1326 and 1328 form a virtual gate that surrounds the region below floating gate 1340, as shown in FIG. 9.

Figure 11:
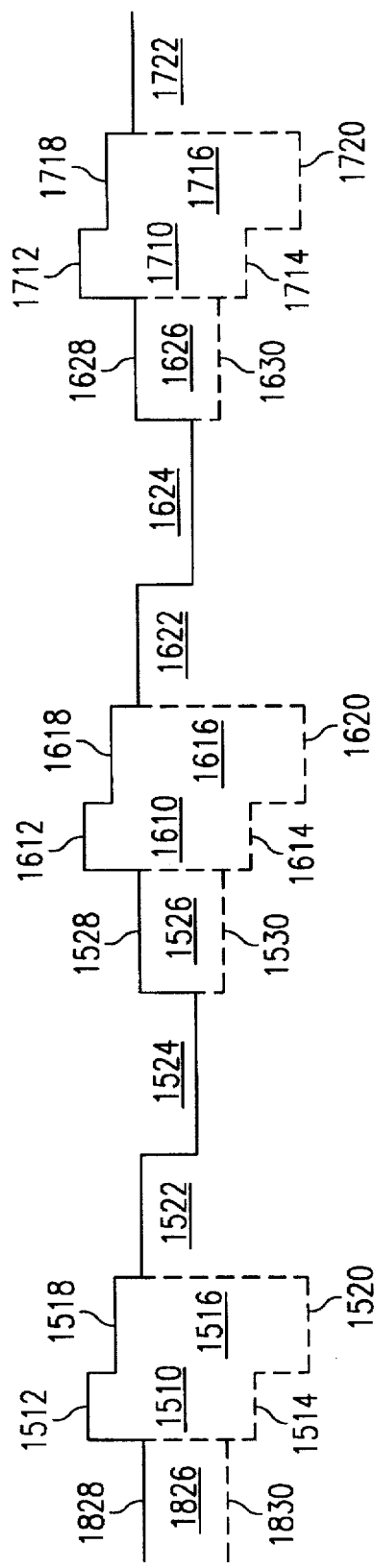
FIG. 11 is a diagram of the potential wells created by the device of FIG. 10.

FIG. 10 is a cross-sectional view of FIG. 9 taken along the axis A–A'. FIG. 11 is a corresponding potential diagram of the same cross-section. The structure of FIG. 10 includes p type silicon substrate 1220, N type layer 1222 in the substrate 1220, P+ virtual gate regions 1224, 1226, 1228, 1326, 1328, and 1426 formed in the upper portion of N type layer 1222, gate insulator layer 1234, transfer gates 1238, 1338, and 1438, floating gates 1240 and 1340, and donor implants 1242, 1342, and 1442 in N type layer 1222. Reset metal leads 1260 and 1360 and floating gate metal leads 1262 and 1362, shown in FIG. 9, are not shown in FIG. 10.

The potential diagram of FIG. 11 includes virtual barrier 1826 with potential levels 1828 and 1830, clocked barrier 1510 with potential levels 1512 and 1514, clocked well 1516 with potential levels 1518 and 1520, virtual barrier 1522, floating gate well 1524, virtual barrier 1526 with potential levels 1528 and 1530, clocked barrier 1610 with potential levels 1612 and 1614, clocked well 1616 with potential levels 1618 and 1620, virtual barrier 622, floating gate well 1624, virtual barrier 1626 with potential levels 1628 and 1630, clocked barrier 1710 with potential levels 1712 and 1714, clocked well 1716 with potential levels 1718 and 1720, and virtual barrier 1722.

Each detection node in FIG. 9 is similar to the detection node in FIG. 4 except the charge drain 1030 of FIG. 4 has been replaced by transfer gates 1338 and 1438. Also, the virtual well 1126 of FIG. 6 has been replaced by virtual barriers 1526 and 1626, which allows the reference voltage $V_{REF}$ to be smaller than the reference voltage $V_{REF2}$ of FIG. 5. The reset metal leads 1260 and 1360 are connected to virtual gates 1228 and 1328, respectively.

The operation of the device of FIG. 10 is similar to that of FIG. 5 and is explained by referring to the potential profile shown in FIG. 11. The energy levels for an electron in the buried channel (conduction band minimum) are shown for the various regions of the device and for different bias levels of the transfer gates 1238, 1338, and 1438, and different bias levels of the virtual gates 1228, 1328, and 1274 (resistive gates). Starting with an electron in the clocked barrier 1510 at level 1514 below transfer gate 1238 with the transfer gate bias approximately equal to substrate bias, the operation is as follows. First the electron moves into clocked well 1516 at level 1520. The electron will remain in clocked well 1516 as long as the transfer gate bias is approximately equal to substrate bias because the potential wells of both adjacent regions are at a lower potential. When transfer gate 1238 is switched to a negative bias with respect to the substrate 1220, the potential level of clocked well 1516 changes to level 1518 and the potential level of clocked barrier 1510 changes to level 1512. As a result, the electron passes from clocked well 1516 to virtual barrier 1522. The electron then moves from virtual barrier 1522 into floating gate well 1524 where the presence of charge is detected through sensing the potential of floating gate 1240.

Then virtual gate 1228 is biased positive which changes the potential level of virtual well 1526 from level 1528 to level 1530. As a result, the electron passes from floating gate well 1524 to resistive gate well 1526. The electron then continues into clocked barrier 1610 and on into clocked well 1616. Charge transfer from clocked well 1616 to clocked well 1716 is the same process as described above for transfer from clocked well 1516 to clocked well 1616.

In FIG. 5 transistor $Q_1$ is used to refresh the potential on the floating gate 1040. For high performance operation transistor $Q_1$ needs to be very small so that the additional capacitance of this structure does not significantly increase the overall floating gate node capacitance and thus reduce the charge detection sensitivity.

Figure 12:
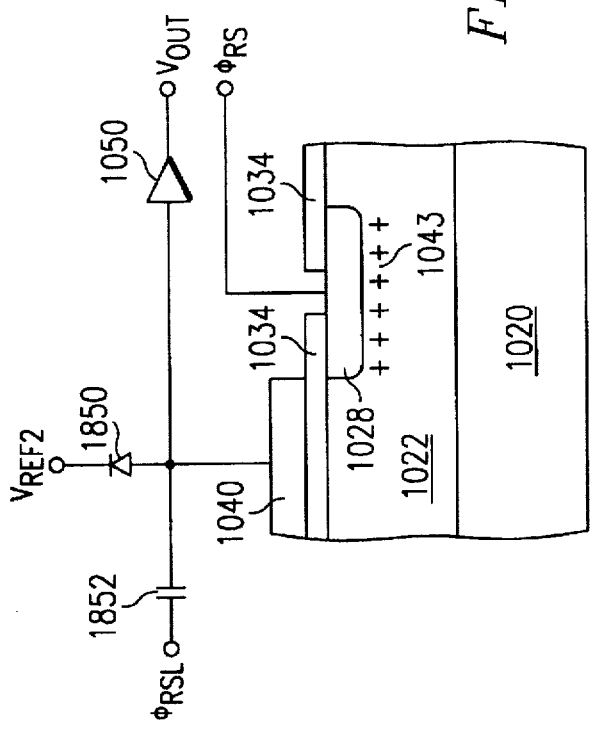
FIG. 12 is an alternative embodiment for restoring the potential on the floating gate shown in FIG. 5.

An alternative embodiment for restoring the potential on the floating gate 1040 is shown in FIG. 12. Transistor $Q_1$ of FIG. 5 is replaced by a small P-N diode 1850 in the circuit of FIG. 12. The feed through coupling from the virtual phase reset gate 1028 causes the diode 1850 to conduct and charge the floating gate 1040 to a new reference level. This level is determined by the $V_{REF2}$ bias and by the magnitude of the reset feed through. Since all the subsequent charge sensing produces potential changes which are in a negative direction (electron sensing) the diode 1850 will remain reverse biased until the next reset pulse from $\phi_{RS}$. The reset pulse at the end of the line which momentarily forward biases the diode 1850 thus only replenishes charge which escaped from the node due to the diode leakage current. The advantages of the diode 1850 include small size, small parasitic capacitance, simplicity of operation, and low noise. Optionally, the refresh pulse $\phi_{RSL}$ can be coupled to the floating gate 1040 through a capacitor 1852. Other reset structures such as JFETs, dual gate MOS transistors, and bipolar transistors can also be used in place of $Q_1$ in FIG. 5.

The charge detection nodes described above provide the advantage of a nondestructive charge detection node. Charge can be sensed multiple times by placing several of the nondestructive charge detection nodes in series. This provides a technique for charge amplification which is important for high resolution image sensing where the pixel area is small and, therefore, the amount of charge generated in each pixel by incident light is small. Also, because of the complete charge clearing reset process of the floating gate detection node, the device has no kTC noise. This leads to lower noise performance.

A few preferred embodiments have been described in detail hereinabove. It is to be understood that the scope of the invention also comprehends embodiments different from those described, yet within the scope of the claims. Words of inclusion are to be interpreted as nonexhaustive in considering the scope of the invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A charge coupled device (CCD) charge detection system comprising:

a first CCD register having N stages and N non-destructive charge readouts, each of the N non-destructive charge readouts is coupled to a readouts is coupled to a corresponding one of the N stages, the N stages are coupled in series for multiple sensing of charge, N is an integer greater than one; and N second CCD registers coupled to the N non-destructive charge readouts, each of the N second CCD registers is coupled to a corresponding one of the N non-destructive charge readouts.

2. The device of claim 1 wherein each of the N non-destructive charge readouts is associated with a corresponding stage of the first CCD register.

3. The device of claim 1 wherein each second CCD register has one less stage than the previous second CCD register.

4. The device of claim 1 wherein outputs of the N second CCD registers are summed together.

* * * * *